(12) United States Patent
Abadeer et al.

(10) Patent No.: US 7,700,428 B2
(45) Date of Patent: Apr. 20, 2010

(54) METHODS OF FABRICATING A DEVICE STRUCTURE FOR USE AS A MEMORY CELL IN A NON-VOLATILE RANDOM ACCESS MEMORY

(75) Inventors: Wagdi W. Abadeer, Jericho, VT (US); Kiran V. Chatty, Williston, VT (US); Robert J. Gauthier, Hinesburg, VT (US); Jed H. Rankin, Richmond, VT (US); Yun Shi, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 12/117,950

(22) Filed: May 9, 2008

(65) Prior Publication Data

US 2009/0280607 A1    Nov. 12, 2009

(51) Int. Cl.
*H01L 21/8238* (2006.01)
(52) U.S. Cl. .............................. 438/211; 257/E21.422; 257/E21.638
(58) Field of Classification Search .................. 438/211; 257/E21.422, E21.613, E21.638, E21.662
See application file for complete search history.

(56) References Cited

U.S. PATENT DOCUMENTS

| | | | |
|---|---|---|---|
| 5,496,765 A | 3/1996 | Schwalke | |
| 5,637,898 A | 6/1997 | Baliga | |
| 5,700,712 A | 12/1997 | Schwalke | |
| 6,140,684 A | 10/2000 | Chan et al. | |
| 6,191,447 B1 | 2/2001 | Baliga | |
| 6,313,482 B1 | 11/2001 | Baliga | |
| 6,365,462 B2 | 4/2002 | Baliga | |
| 6,635,544 B2 | 10/2003 | Disney | |
| 6,750,105 B2 | 6/2004 | Disney | |

(Continued)

OTHER PUBLICATIONS

Ahn, et al., Comparison of Performance and Reliability Between MOSFET's with LPCVD Gate Oxide and Thermal Gate Oxide, IEEE Transactions on Electron Devices, vol. 38, No. 12, Dec. 1991 (2 pages).

Ahn, et al., "Electrical Properties of MOSFET's with N20-Nitrided LPCVD SiO2 Gate Dielectrics", IEEE Electron Device Letters, vol. 13, No. 9, Sep. 1992 (3 pages).

(Continued)

*Primary Examiner*—Caridad M Everhart
(74) *Attorney, Agent, or Firm*—Wood, Herron & Evans LLP (57) ABSTRACT

Methods for fabricating a device structure for use as a memory cell in a non-volatile random access memory. The method includes forming first and second semiconductor bodies on the insulating layer that have a separated, juxtaposed relationship, doping the first semiconductor body to form a source and a drain, and partially removing the second semiconductor body to define a floating gate electrode adjacent to the channel of the first semiconductor body. The method further includes forming a first dielectric layer between the channel of the first semiconductor body and the floating gate electrode, forming a second dielectric layer on a top surface of the floating gate electrode, and forming a control gate electrode on the second dielectric layer that cooperates with the floating gate electrode to control carrier flow in the channel in the first semiconductor body.

7 Claims, 6 Drawing Sheets

U.S. PATENT DOCUMENTS

| | | |
|---|---|---|
| 6,764,889 B2 | 7/2004 | Baliga |
| 7,019,342 B2 | 3/2006 | Hackler, Sr. et al. |
| 7,078,296 B2 | 7/2006 | Chau et al. |
| 7,235,439 B2 | 6/2007 | Udrea et al. |
| 2005/0242368 A1 | 11/2005 | Udrea et al. |
| 2005/0242369 A1 | 11/2005 | Udrea et al. |

OTHER PUBLICATIONS

Lee, et al., "Statistical Modeling of Silicon Dioxide Reliability", IEEE Reliability Physics Symposium, 26th Annual Proceedings, 1998, pp. 131-138.

Lee, et al., "Modeling and Characteriziation of Gate Oxide Reliability", IEEE Transactions on Electron Devices, vol. 35, No. 12, Dec. 1998, pp. 2268-2278.

METHODS OF FABRICATING A DEVICE STRUCTURE FOR USE AS A MEMORY CELL IN A NON-VOLATILE RANDOM ACCESS MEMORY

CROSS-REFERENCE TO RELATED APPLICATIONS

This application is related to application Ser. No. 12/118,241, filed as on even date herewith and entitled "Device Structures for a Memory Cell of a Non-Volatile Random Access Memory and Design Structures for a Non-Volatile Random Access Memory", which is hereby incorporated by reference herein in its entirety. This application is also related to commonly-owned application Ser. No. 11/972,941, filed Jan. 11, 2008, and commonly-owned application Ser. No. 11/972,949, filed Jan. 11, 2008.

FIELD OF THE INVENTION

The invention relates generally to semiconductor device fabrication and, in particular, to methods for fabricating a device structure for a memory cell used in a non-volatile random access memory (NVRAM) using complementary metal-oxide-semiconductor (CMOS) processes.

BACKGROUND OF THE INVENTION

Conventional device structures for a field effect transistor (FET) fabricated using complementary metal-oxide-semiconductor (CMOS) process technologies include a semiconductor layer, a source and a drain defined in the semiconductor layer, a channel defined in the semiconductor layer between the source and drain, and a control gate electrode. The material constituting the gate electrode in such conventional planar device structures contains polycrystalline silicon (polysilicon) or a metal applied by an additive process that involves blanket deposition of the material and patterning with a conventional lithography and etching process. When a control voltage exceeding a characteristic threshold voltage is applied to the control gate electrode, an inversion or depletion layer is formed in the channel by the resultant electric field and carrier flow occurs in the depletion layer between the source and drain (i.e., the device output current).

Non-volatile random access memory (NVRAM) refers generally any type of random access memory that retains the stored binary data even when not powered. A conventional device structure used as a memory cell in a NVRAM modifies a standard FET to add an electrically isolated or floating gate electrode that affects conduction between the source and drain. A tunnel dielectric layer is interposed between the floating gate electrode and the channel. The control gate electrode is separated from the floating gate electrode by an intergate dielectric layer.

Improved fabrication methods are needed for the memory cells of a NVRAM that permit the use of high operating voltages and that simplify device fabrication using CMOS technology.

SUMMARY OF THE INVENTION

In one embodiment, a method is provided for fabricating a device structure for a NVRAM on an insulating layer. The method includes forming first and second semiconductor bodies on the insulating layer that have a separated, juxtaposed relationship, doping the first semiconductor body to form a source and a drain separated by a channel, and partially removing the second semiconductor body to define a floating gate electrode adjacent to the channel of the first semiconductor body. The method further includes forming a first dielectric layer between the channel of the first semiconductor body and the floating gate electrode, forming a second dielectric layer on a top surface of the floating gate electrode, and forming a control gate electrode on the second dielectric layer that cooperates with the floating gate electrode to control carrier flow in the channel in the first semiconductor body.

DETAILED DESCRIPTION

Figure 1A:
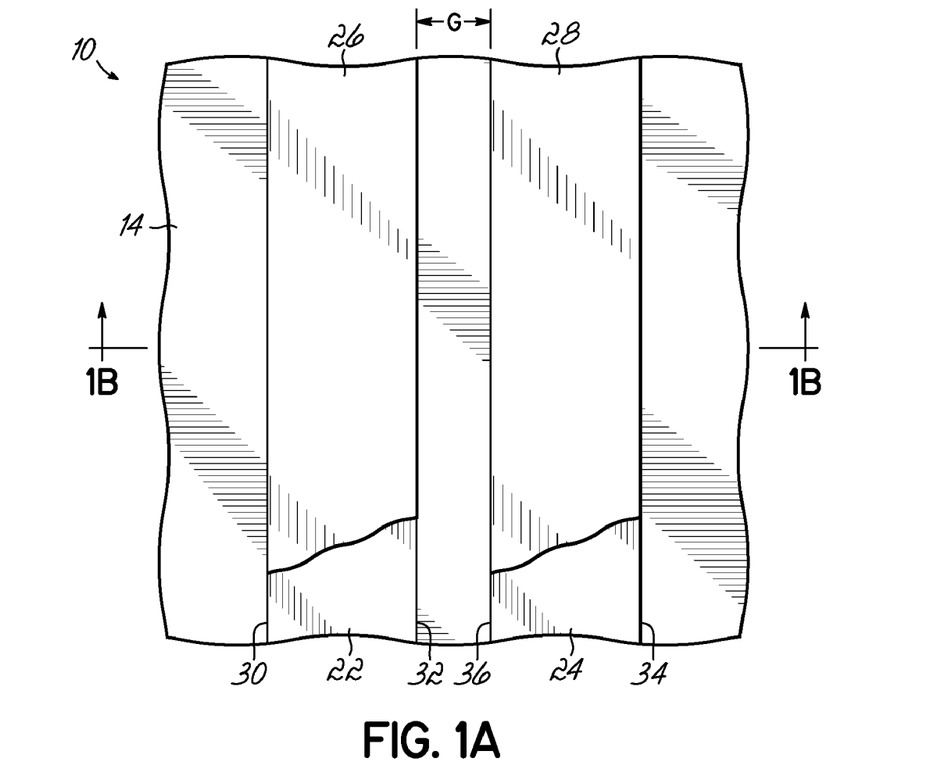
FIG. 1A is a diagrammatic top plan view of a device structure built on a portion of a semiconductor-on-insulator substrate at an initial fabrication stage of a processing method in accordance with an embodiment of the invention.
Figure 1B:
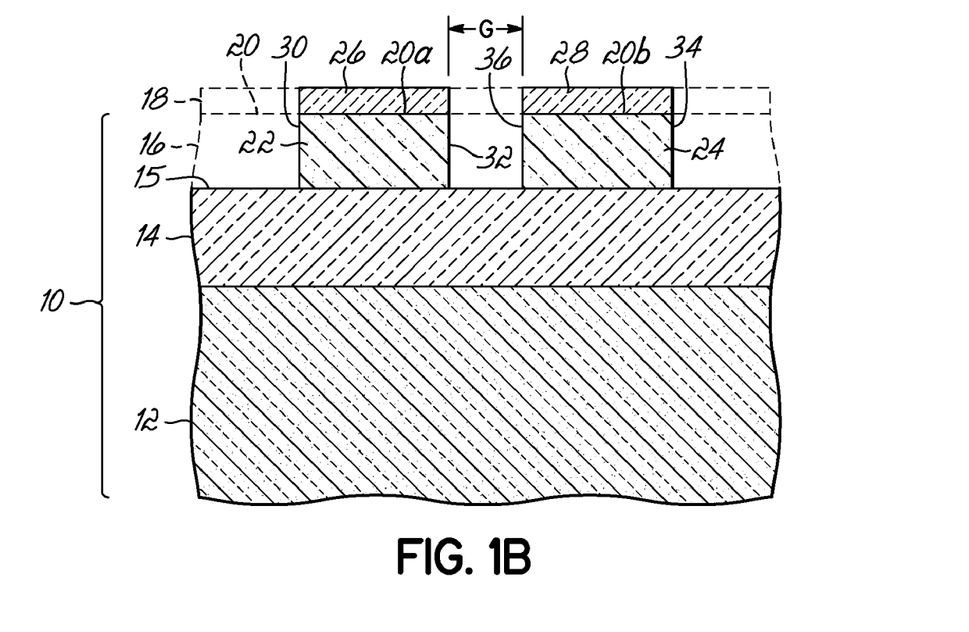
FIG. 1B is a diagrammatic cross-sectional view taken generally along line 1B-1B in FIG. 1A.

With reference to FIGS. 1A,B and in accordance with an embodiment of the invention, a semiconductor-on-insulator (SOI) substrate 10 includes a handle wafer 12, a buried insulating layer 14, and an active semiconductor or SOI layer 16 separated, and electrically isolated, from the handle wafer 12 by the intervening buried insulating layer 14. The handle wafer 12 may be constituted by a single crystal or monocrystalline semiconductor material, such as silicon, or another type of material. The buried insulating layer 14 may be formed of an electrically-insulating material, such as silicon dioxide (e.g., $SiO_2$), or another type of dielectric material. The SOI layer 16 is constituted by a single crystal or monocrystalline semiconductor material, such as silicon or a material that primarily contains silicon. The SOI layer 16 is considerably thinner than the handle wafer 12 and directly contacts a top surface 15 of the buried insulating layer 14 to define an interface.

A pad layer 18 is disposed on a top surface 20 of the SOI layer 16 across the SOI substrate 10. The material forming the pad layer 18 is selected to operate as a hardmask that etches selectively to the semiconductor material constituting the SOI layer 16. The hardness and wear resistance of the material constituting pad layer 18 are also adequate to function as a polish stop layer and reactive ion etch mask during subsequent fabrication stages. In one embodiment, the material of pad layer 18 may be $SiO_2$ deposited by a thermal CVD process or $SiO_2$ grown by oxidizing the SOI layer 16. Alternatively, the pad layer 18 may be composed of a different type of material, such as silicon oxynitride ($SiO_xN_y$), or a layered combination of materials.

The semiconductor material of the SOI layer 16 is patterned by a conventional lithography and anisotropic etching process to define a plurality of bodies, of which representative bodies 22, 24 are visible in FIGS. 1A,B. The lithography process applies a resist (not shown) on pad layer 18, exposes the resist to a pattern of radiation, and develops the transferred pattern in the exposed resist. The resist pattern is transferred to the SOI layer 16 by a series of anisotropic dry etches, such as reactive-ion etching (RIE) or a plasma etching process, that patterns the pad layer 18 using the patterned resist as an etch mask, strips the residual resist, and then patterns the SOI layer 16 using the patterned pad layer 18 as an etch mask. The etching process removes the material of the SOI layer 16 selective (i.e., at a significantly higher etch rate) to the material of the pad layer 18 and stops on the buried insulating layer 14.

The bodies 22, 24 of semiconductor material are in direct contact with the top surface 15 of buried insulating layer 14. The bodies 22, 24 are juxtaposed adjacent, parallel lines of the semiconductor material originating from the SOI layer 16 and have respective top surfaces 20a, 20b defined from top surface 20 after the lithography and etching process. Residual dielectric caps 26, 28 represent residual portions of the material of pad layer 18 that remain intact after etching and cover the respective bodies 22, 24 in a stacked arrangement. Dielectric caps 26, 28 have approximately the same footprint, in terms of width and length, as the bodies 22, 24.

Sidewalls 30, 32 of body 22 intersect the buried insulating layer 14 and extend from the buried insulating layer 14 toward the top surface 20a of the body 22. Body 24 includes sidewalls 34, 36 that extend from buried insulating layer 14 toward the top surface 20b and intersect the buried insulating layer 14. Sidewall 32 of body 22 is contained in a plane that is aligned substantially parallel to, but spaced from, a plane containing sidewall 36 of body 24. Bodies 22, 24 each include additional sidewalls (not shown) that connect sidewalls 30, 32 and sidewalls 34, 36, respectively, so that the bodies 22, 24 have a closed outer peripheral boundary. Sidewalls 32, 36 are separated by a gap, G, between the bodies 22, 24. The magnitude of the gap, G, is fixed by the line width and pitch of the lithography, or, alternatively, may be fixed by a sub-lithographic definition process, such as pitch doubling sidewall image transfer.

Figure 2A:
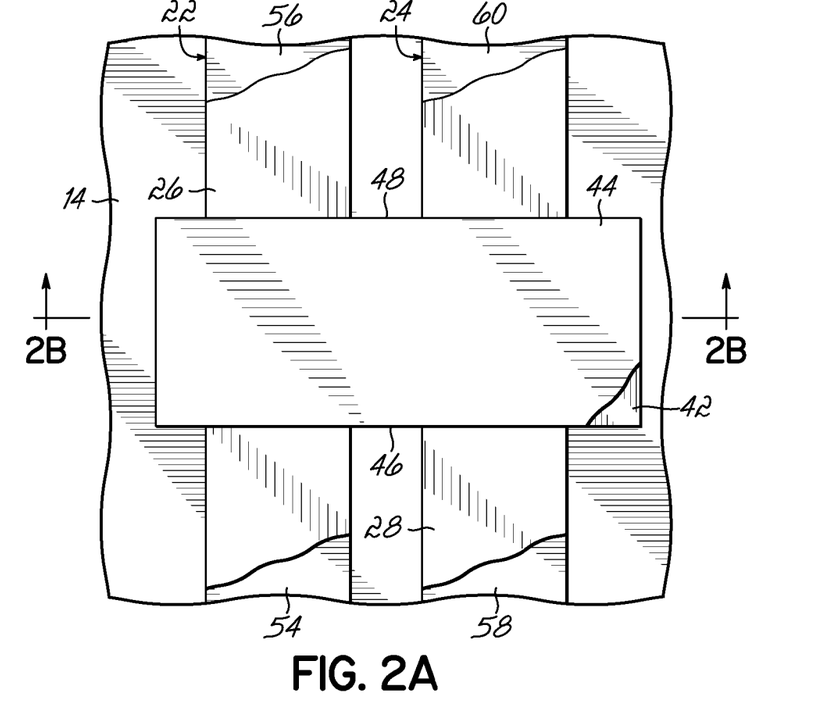
FIG. 2A is a diagrammatic top plan view of the device structure of FIG. 1A at a subsequent fabrication stage.

With reference to FIGS. 2A,B in which like reference numerals refer to like features in FIGS. 1A,B and at a subsequent fabrication stage, a dielectric layer 38 is formed on the sidewalls 30, 32 of body 22 and a dielectric layer 40 is formed on the opposite sidewalls 34, 36 of body 24. The dielectric layers 38, 40 are composed of a suitable dielectric material. In one embodiment, the dielectric material constituting dielectric layers 38, 40 may be $SiO_2$ grown by a thermal oxidation process that entails exposing the bodies 22, 24 to a dry or wet oxygen-laden, heated ambient in, for example, an oxidation furnace or a rapid thermal anneal chamber. Oxidation conditions are selected to provide an appropriate thickness for the dielectric layers 38, 40 to at least partially fill the gap, G. In the representative embodiment, the dielectric layers 38, 40 only partially fill the gap, G, between sidewalls 32, 36 of bodies 22, 24, although the embodiments of the invention are not so limited.

Figure 2B:
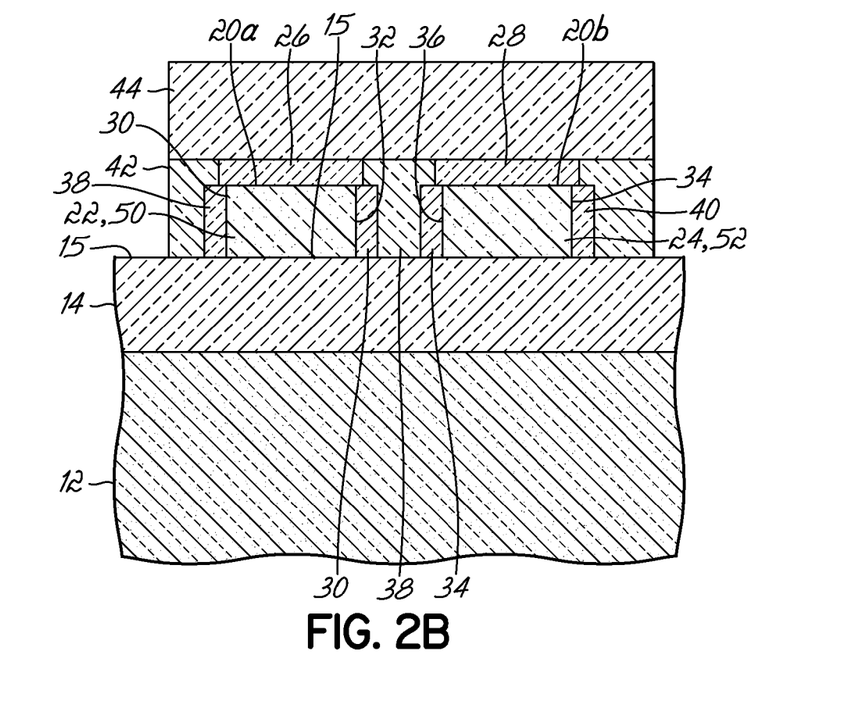
FIG. 2B is a diagrammatic cross-sectional view taken generally along line 2B-2B in FIG. 2A.

The open spaces surrounding, and between, the bodies 22, 24 are filled by a layer 42 of a gap-fill dielectric material. In particular, a portion of the dielectric layer 42 fills the remainder of the narrowed gap, G, between the sidewalls 32, 36 that is unfilled by dielectric layers 38, 40. The dielectric layer 42 may be composed of stoichiometric or non-stoichiometric $SiO_2$ deposited by a chemical vapor deposition (CVD) process, or other dielectrics, including ($SiO_xN_y$), hafnium oxide, or any other material with predominately dielectric properties. The dielectric layer 42 is planarized by a conventional planarization process, such as a chemical mechanical polishing (CMP) process, that removes the overburden of the blanket dielectric layer 42 and stops on the dielectric caps 26, 28. Typically if the dielectric material is $SiO_2$, the quality of $SiO_2$ in the dielectric layers 38, 40 is superior to the quality of the $SiO_2$ in dielectric layer 42 because of difference in the formation processes.

A person having ordinary skill in the art will appreciate that the portion of the dielectric layer 42 in the gap, G, between the sidewalls 32, 36 is optional and that the dielectric layers 38, 40 may be formed with a thickness sufficient to completely fill and close the gap, G, between the sidewalls 32, 36.

A photoresist mask 44 is then formed from a resist layer that is patterned by a conventional lithography and anisotropic etching process. Opposite sidewalls 46, 48 of the photoresist mask 44 have a roughly orthogonal alignment relative to the sidewalls 30, 32, 34, 36 of the bodies 22, 24. The material of the dielectric layers 38, 40, 42 is removed selective to the semiconductor material of the bodies 22, 24 by an anisotropic etching process. Because of the masking effect of the photoresist mask 44, dielectric material in the dielectric caps 26, 28 and portions of the dielectric layers 38, 40, 42 located beneath the photoresist mask 44 are preserved during the etching process. The etching process removes the dielectric caps 26, 28 and dielectric layers 38, 40, 42 outside of the protective footprint of the photoresist mask 44 selective to the semiconductor material of bodies 22, 24 so that the unmasked semiconductor material of the bodies 22, 24 is exposed.

After etching, the photoresist mask 44 intersects body 22 along a central channel 50 and covers a portion 52 of body 24. Opposite end regions 54, 56 of body 22, which flank the channel 50 and opposite end regions 58, 60 of body 24 project or protrude outwardly from opposite sidewalls 46, 48 of the photoresist mask 44. Source/drain regions for a device structure, which is generally indicated by reference numeral 68 (FIGS. 5A,B), are defined in the end regions 54, 56 of body 22 by implanting a suitable dose of an n-type or p-type dopant, which is selected according to the device type. The implanted dopant is blocked from entering the channel 50 of body 22 and the covered portion 52 of body 24 by the photoresist mask 44. End regions 58, 60 of body 24, which are unmasked and receive dopant when end regions 54, 56 of body 22 are implanted, are excised in a subsequent fabrication stage. Angled ion implantations may be used to optionally introduce shallow source/drain extensions and halos (not shown) in body 22 beneath the opposing sidewalls 46, 48 of the photoresist mask 44.

Figure 3A:
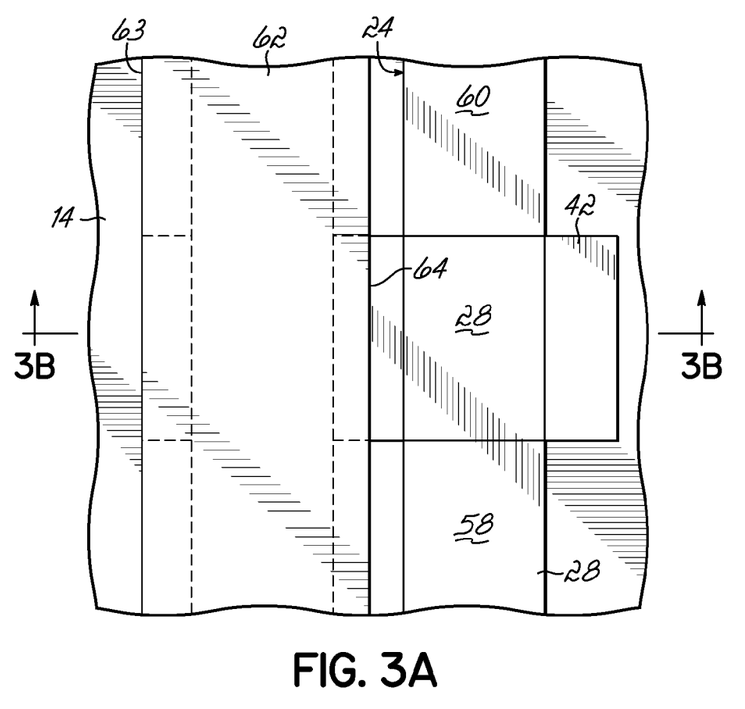
FIG. 3A is a diagrammatic top plan view of the device structure of FIG. 2A at a subsequent fabrication stage.
Figure 3B:
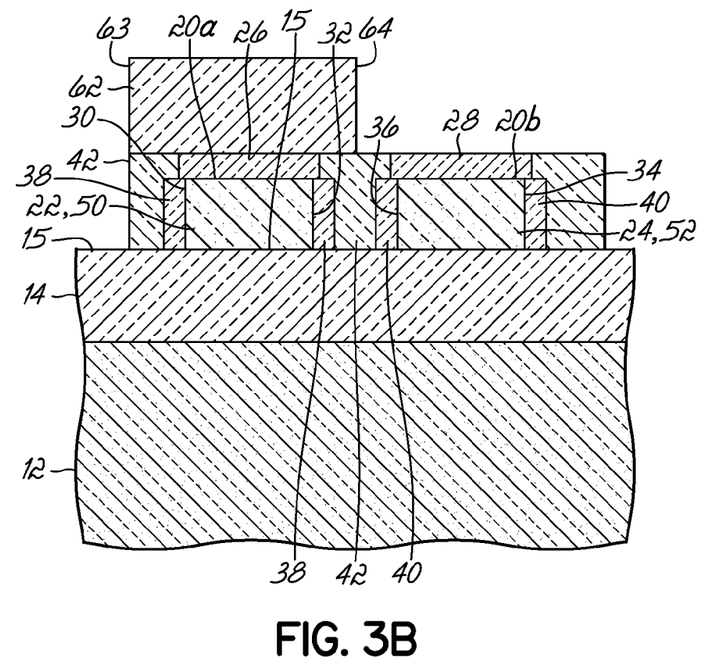
FIG. 3B is a diagrammatic cross-sectional view taken generally along line 3B-3B in FIG. 3A.

With reference to FIGS. 3A,B in which like reference numerals refer to like features in FIGS. 2A,B and at a subsequent fabrication stage, the photoresist mask 44 (FIGS. 2A,B) is removed by, for example, plasma ashing or chemical stripping. A photoresist mask 62 is then formed by patterning an applied resist layer with a conventional lithography and anisotropic etching process. The photoresist mask 62 has sidewalls 63, 64 extending laterally beyond the respective sidewalls 30, 32 of body 22. The sidewalls 63, 64 have a parallel alignment with the sidewalls 30, 32 of body 22. During the etching process, the dielectric cap 28 and dielectric layers 40, 42 operate as a hard mask for the covered portion 52 of body 24.

Figure 4A:
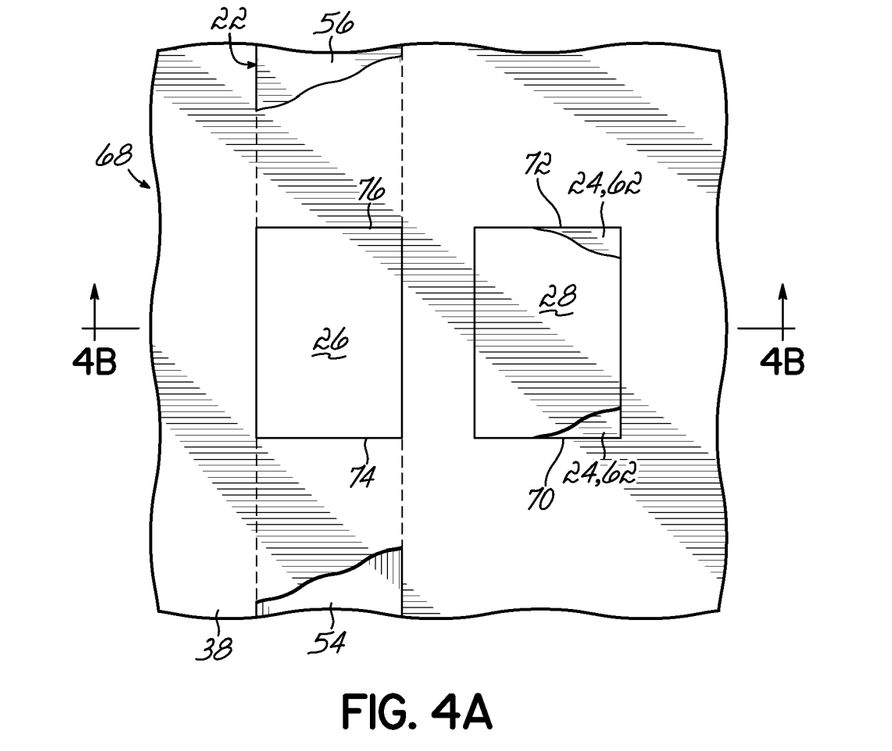
FIG. 4A is a diagrammatic top plan view of the device structure of FIG. 3A at a subsequent fabrication stage.
Figure 4B:
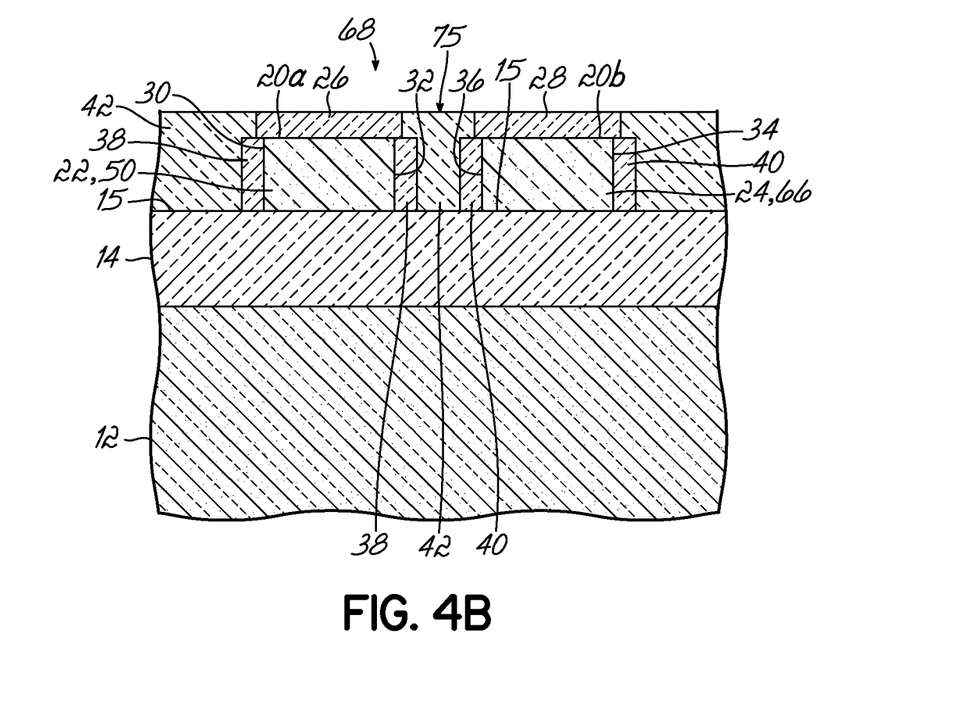
FIG. 4B is a diagrammatic cross-sectional view taken generally along line 4B-4B in FIG. 4A.
Figure 5A:
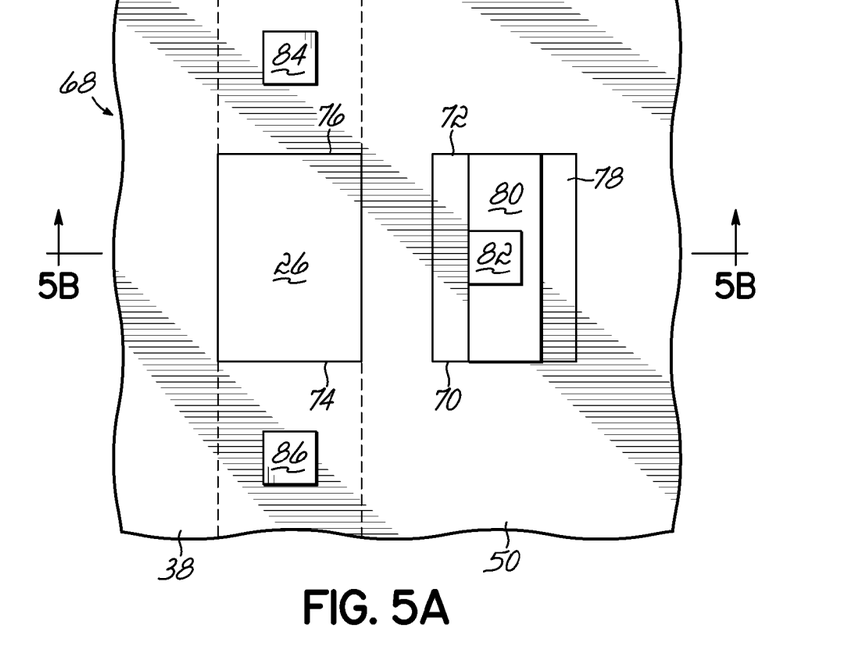
FIG. 5A is a diagrammatic top plan view of the device structure of FIG. 4A at a subsequent fabrication stage.

With reference to FIGS. 4A,B in which like reference numerals refer to like features in FIGS. 3A,B and at a subsequent fabrication stage, the unprotected semiconductor material in the end regions 58, 60 of the body 24 is removed by an anisotropic etching process that removed the body 24 selective to dielectric cap 28 and dielectric layers 40, 42. The covered portion 52 (FIG. 3B) of the semiconductor material of body 24, which is preserved during etching, serves as a floating gate electrode 66 for the device structure 68 (FIGS. 5A,B). The etching process, which stops on the buried insulating layer 14, truncates the body 24 so that floating gate electrode 66 has opposite sidewalls 70, 72 that extend from the buried insulating layer 14 to the top surface 20b. The photoresist mask 44, which protects the opposite end regions 54, 56 of body 22 during the etching process, is removed by, for example, plasma ashing or chemical stripping.

The hard mask supplied by the dielectric cap 28 and the presence of the dielectric layers 40, 42, as well as the presence of the photoresist mask 62, operates to self-align the floating gate electrode 66 with the channel 50 of body 22, as well as to self-align the floating gate electrode 66 with the source/drain regions in the doped opposite end regions 54, 56 of body 24. Specifically, sidewall 70 of the floating gate electrode 66 is generally aligned (i.e., coplanar) with a planar interface between the channel 50 in body 22 and the doped region in the end region 54 of body 22 representing one of the source/drain regions for the device structure 68. Similarly, sidewall 72 of the floating gate electrode 66 is generally aligned (i.e., coplanar) with a planar interface between the channel 50 in body 22 and the doped region in the end region 56 of body 22 representing another of the source/drain regions for the device structure 68. These planar interfaces, which represent transitions in the net conductivity type of the semiconductor material of body 22, are generally vertically aligned with opposite sidewalls 74, 76 of the dielectric cap 26 and extend through the body 22 from the top surface 20a to the buried insulating layer 14.

The floating gate electrode 66 is physically separated from the channel 50 of body 22 by the thickness of the dielectric layer 38 on sidewall 36 of body 22, the thickness of the dielectric layer 40 on sidewall 36 of body 24, and the thickness of the portion of the dielectric layer 42 between dielectric layers 38, 40, which collectively define a tunnel dielectric layer generally indicated by reference numeral 75. The tunnel dielectric layer 75 physically separates the floating gate electrode 66 from the channel 50 of body 22 and electrically isolates the floating gate electrode 66 from the channel 50. The thickness of the tunnel dielectric layer 75, which is primarily determined when the SOI layer 16 is lithographically patterned, is selected to prevent excess charge leakage from the floating gate electrode 66 that, if not prevented, would reduce data retention time. The body 22 containing channel 50 and the floating gate electrode 66 have nominally equal thicknesses measured from their respective top surfaces 20a, 20b to the buried insulating layer 14 and are composed of substantially identical portions of monocrystalline silicon that originated from the SOI layer 16.

With reference to FIGS. 5A,B in which like reference numerals refer to like features in FIGS. 4A,B and at a subsequent fabrication stage, the dielectric cap 28 is removed from the top surface 20b of body 24 by an etching process, which provides access to the top surface 20b and a gate stack is formed on the top surface 20b of body 22. The gate stack includes a thin intergate dielectric layer 78 and a control gate electrode 80, which is separated from the top surface 20b of the body 22 by the intergate dielectric layer 78. The gate stack is formed by growing or depositing a layer of a dielectric material intended to constitute the intergate dielectric layer 78 on the top surface 20b, depositing a layer of a conductor intended to constitute the control gate electrode 80 on the dielectric material, and patterning these conductor and dielectric layers using a conventional photolithography and etching process, as described hereinabove. In one embodiment, the intergate dielectric layer 78 and control gate electrode 80 may be formed by conventional CMOS fabrication steps when gate stacks are formed for low power metal-oxide-semiconductor field effect transistors (MOSFETs) on other regions of the substrate 10. The intergate dielectric layer 78 is thinner than the tunnel dielectric layer 75, which promotes the operability of the device structure 68 as a memory cell in a NVRAM.

Figure 5B:
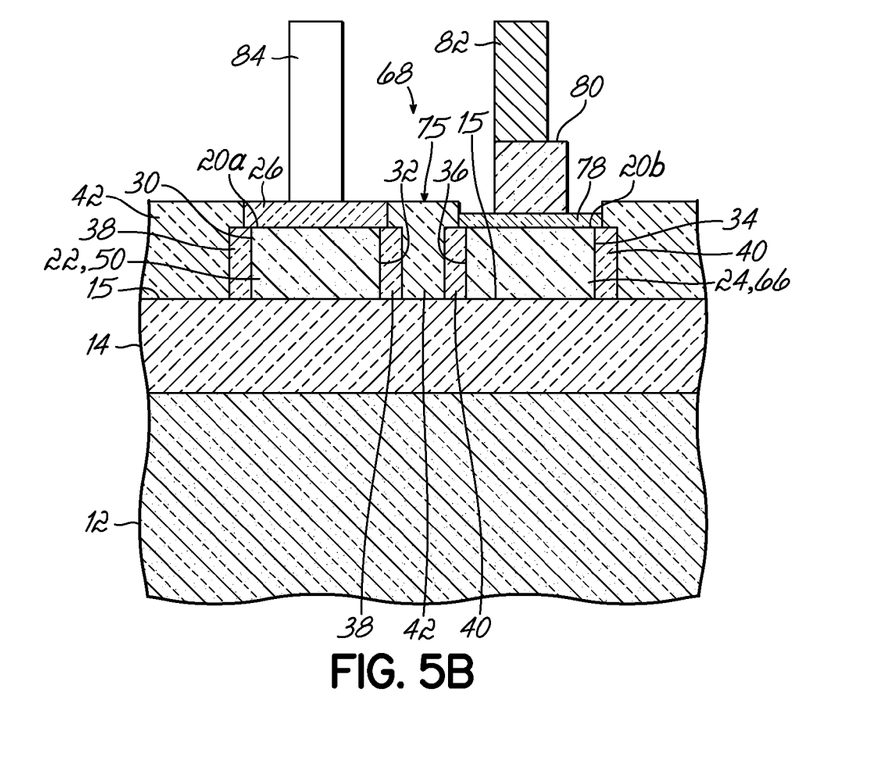
FIG. 5B is a diagrammatic cross-sectional view taken generally along line 5B-5B in FIG. 5A.

Candidate dielectric materials for the intergate dielectric layer 78 include, but are not limited to, $SiO_xN_y$, $Si_3N_4$, $SiO_2$, and layered stacks of these materials, as well as other dielectric materials (e.g., hafnium-based high-k dielectrics) characterized by a relatively high permittivity. The control gate electrode 80 may be formed by conventional photolithography and etching process and may be composed of a conductor, such as a metal or doped polycrystalline silicon (i.e., doped polysilicon). Sidewall spacers (not shown) composed of a dielectric material, such as $Si_3N_4$, may be formed on the sidewalls of control gate electrode 80 by a conventional spacer formation process.

Device structure 68 includes the source/drain regions defined in the end regions 54, 56 (FIG. 4A) of body 22, the channel 50 defined between the end regions 54, 56 of body 22, the floating gate electrode 66 defined from the adjacent body 24 of single crystal semiconductor, and the control gate electrode 80, as well as the tunnel dielectric layer 75 separating the floating gate electrode 66 from the channel 50 and the intergate dielectric layer 78 separating the electrodes 66, 80. The body thickness of the body 22, the thickness of the intergate dielectric layer 78, and the thickness of the tunnel dielectric layer 75 can be independently adjusted during fabrication. The arrangement of the body 22, the floating gate electrode 66, and the control gate electrode 80 forms an L-shaped device construction.

When device structure 68 is used as a NVRAM memory cell, charge stored on the floating gate electrode 66 represents binary data. To provide one binary state, the floating gate electrode 66 is charged during a write operation in which charge carriers tunnel or are injected from the biased control gate electrode 80 through the tunnel dielectric layer 75 to the floating gate electrode 66. Because the floating gate electrode 66 is electrically isolated, the charge stored by the floating gate electrode 66 remains intact in the absence of being refreshed. To provide the opposite binary state, the charge stored by the floating gate electrode 66 can be removed by reversing the bias on the control gate electrode 80, which drains charge carriers from the floating gate electrode 66. The binary data stored by the device structure 68 is read by biasing the source/drain regions in the end regions 54, 56 of body 22 and sensing the current flowing in at least the portion of the channel 50 adjacent to sidewall 32. This magnitude of the current flowing in the portion of the channel 50 is influenced by the charge stored by the floating gate electrode 66.

During the fabrication process, the device structure 68 is replicated across at least a portion of the surface area of the SOI layer 16 of the SOI substrate 10. Standard processing follows, which includes formation of metallic contacts, metallization for the M1 level interconnect wiring, and interlayer dielectric layers, conductive vias, and metallization for upper level (M2-level, M3-level, etc.) interconnect wiring. Metallization in the contact level of the interconnect wiring establishes a local electrical contact 82 with the control gate electrode 80 and local electrical contacts 84, 86 with the source/drain regions defined in the end regions 54, 56 of body 22. The floating gate electrode 66 remains uncontacted and, therefore, is available for binary charge storage. Other types of device structures may be fabricated on other surface areas of the SOI substrate 10 and entirely independent of the fabrication process forming device structures like device structure 68, or some of the process steps may be shared with steps used to form the conventional devices.

Figure 6:
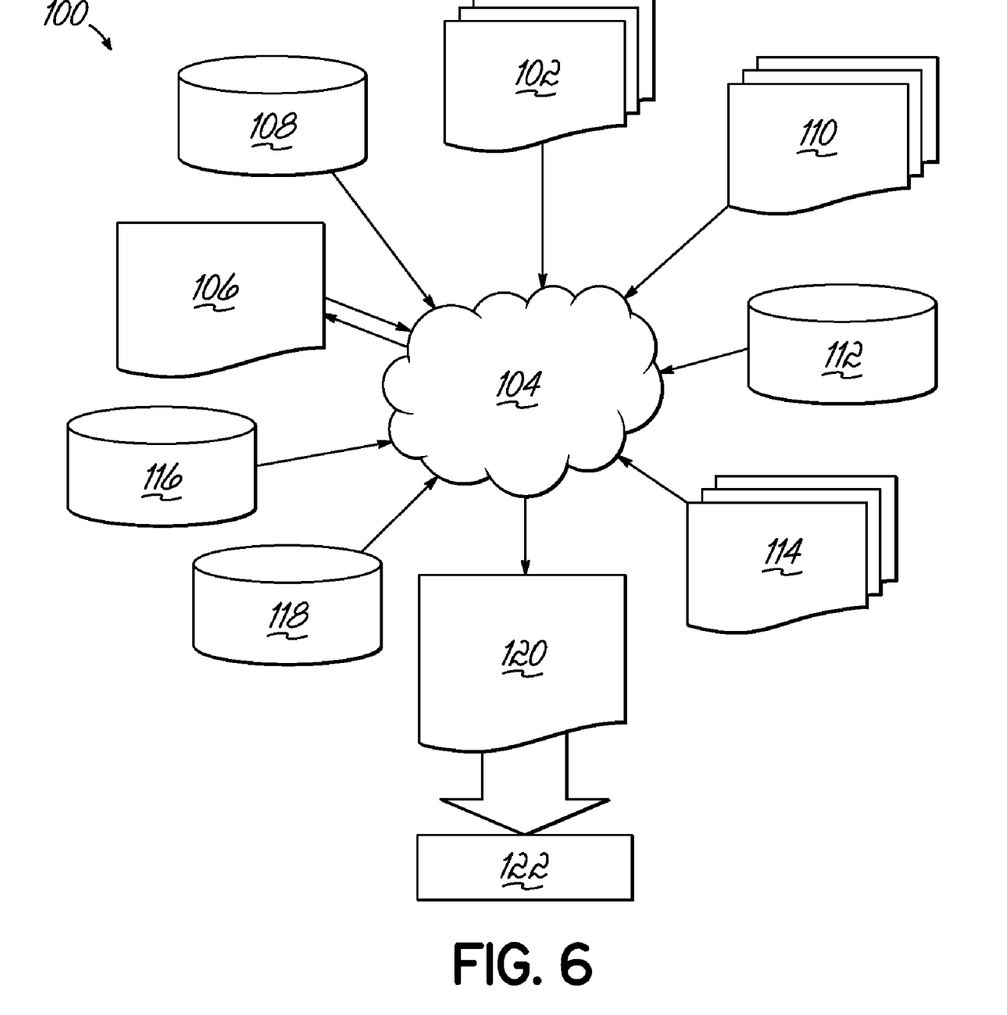
FIG. 6 is a flow diagram of a design process used in semiconductor design, manufacture, and/or test.

FIG. 6 shows a block diagram of an exemplary design flow 100 used for example, in semiconductor design, manufacturing, and/or test. Design flow 100 may vary depending on the type of integrated circuit (IC) being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc. Design structure 102 is preferably an input to a design process 104 and may come from an IP provider, a core developer, or other design company or may be generated by the operator of the design flow, or from other sources. Design structure 102 comprises an embodiment of the invention as shown in FIGS. 5A, 5B in the form of schematics or HDL, a hardware-description language (e.g., Verilog, VHDL, C, etc.). Design structure 102 may be contained on one or more machine readable medium. For example, design structure 102 may be a text file or a graphical representation of an embodiment of the invention as shown in FIGS. 5A, 5B. Design process 104 preferably synthesizes (or translates) an embodiment of the invention as shown in FIGS. 5A, 5B into a netlist 106, where netlist 106 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 106 is resynthesized one or more times depending on design specifications and parameters for the circuit.

Design process 104 may include using a variety of inputs; for example, inputs from library elements 108 which may house a set of commonly used elements, circuits, and devices, including models, layouts, and symbolic representations, for a given manufacturing technology (e.g., different technology nodes, 32 nm, 45 nm, 90 nm, etc.), design specifications 110, characterization data 112, verification data 114, design rules 116, and test data files 118 (which may include test patterns and other testing information). Design process 104 may further include, for example, standard circuit design processes such as timing analysis, verification, design rule checking, place and route operations, etc. One of ordinary skill in the art of integrated circuit design can appreciate the extent of possible electronic design automation tools and applications used in design process 104 without deviating from the scope and spirit of the invention. The design structure of the invention is not limited to any specific design flow.

Design process 104 preferably translates an embodiment of the invention as shown in FIGS. 5A, 5B, along with any additional integrated circuit design or data (if applicable), into a second design structure 120. Design structure 120 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 120 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 5A, 5B. Design structure 120 may then proceed to a stage 122 where, for example, design structure 120 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art.

Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for forming a non-volatile random access memory on an insulating layer, the method comprising:
    forming first and second semiconductor bodies on the insulating layer that have a separated, juxtaposed relationship;
    doping the first semiconductor body to form a source and a drain separated by a channel;
    partially removing the second semiconductor body to define a floating gate electrode adjacent to the channel of the first semiconductor body;
    forming a first dielectric layer between the channel of the first semiconductor body and the floating gate electrode;
    forming a second dielectric layer on a top surface of the floating gate electrode; and
    forming a control gate electrode on the second dielectric layer that cooperates with the floating gate electrode to control carrier flow in the channel in the first semiconductor body.

2. The method of claim 1 wherein the first and second semiconductor bodies are concurrently formed from a single crystal silicon layer carried on the insulating layer, and forming the first and second semiconductor bodies further comprises:
    forming a hard mask on the single crystal silicon layer;
    patterning the hard mask with masked regions that are complimentary to the first and second semiconductor bodies; and
    removing unmasked portions of the single crystal silicon layer to form the first and second semiconductor bodies.

3. The method of claim 1 further comprising:
    depositing another insulating layer that covers the top surface of the floating gate electrode;
    depositing a conductor layer on the insulating layer covering the top surface of the floating gate electrode; and
    patterning the conductor layer and the insulating layer covering the top surface of the floating gate electrode to respectively define the control gate electrode and the second dielectric layer.

4. The method of claim 1 wherein the first semiconductor body includes a first sidewall and the second semiconductor body includes a second sidewall that confronts the first sidewall, and forming the first dielectric layer further comprises:
    growing a first silicon dioxide layer on the first sidewall of the first semiconductor body; and
    growing a second silicon dioxide on the second sidewall of the second semiconductor body.

5. The method of claim 4 wherein the first and second silicon dioxide layers are separated by a gap, and forming the first dielectric layer further comprises:
    depositing a fill layer of a dielectric material to fill between the first and second silicon dioxide layers.

6. The method of claim 1 wherein partially removing the second semiconductor body further comprises:
    partially masking the second semiconductor body with a dielectric cap; and
    removing unmasked end portions of the second semiconductor body with an etching process that removes the unmasked end portions selective to the dielectric cap to define the floating gate electrode.

7. The method of claim 6 further comprising:
    forming a photoresist mask on the first semiconductor body to protect the first semiconductor body against the etching process when the unmasked end portions of the second semiconductor body are removed.

* * * * *